United States Patent
Chen et al.

(10) Patent No.: US 10,727,151 B2
(45) Date of Patent: Jul. 28, 2020

(54) SEMICONDUCTOR CHIP PACKAGE HAVING A COOLING SURFACE AND METHOD OF MANUFACTURING A SEMICONDUCTOR PACKAGE

(71) Applicant: Infineon Technologies AG, Neubiberg (DE)

(72) Inventors: Liu Chen, Oberhaching (DE); Teck Sim Lee, Melaka (MY); Jia Yi Wong, Melaka (MY); Wei Han Koo, Melaka (MY); Thomas Stoeck, Buxtehude (DE); Gilles Delarozee, Gruenwald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/605,091

(22) Filed: May 25, 2017

(65) Prior Publication Data
US 2018/0342438 A1 Nov. 29, 2018

(51) Int. Cl.
| | |
|---|---|
| *H01L 23/367* | (2006.01) |
| *H01L 23/492* | (2006.01) |
| *H01L 23/495* | (2006.01) |
| *H01L 21/56* | (2006.01) |
| *H01L 23/433* | (2006.01) |
| *H01L 23/31* | (2006.01) |
| *H01L 23/36* | (2006.01) |

(Continued)

(52) U.S. Cl.
CPC ........ *H01L 23/3675* (2013.01); *H01L 21/568* (2013.01); *H01L 23/3107* (2013.01); *H01L 23/36* (2013.01); *H01L 23/4334* (2013.01); *H01L 23/492* (2013.01); *H01L 23/49513* (2013.01); *H01L 23/49524* (2013.01); *H01L 23/49551* (2013.01); *H01L 23/49562* (2013.01); *H01L 23/49568* (2013.01); *H01L 21/565* (2013.01); *H01L 23/3121* (2013.01); *H01L 23/3736* (2013.01); *H01L 23/49861* (2013.01); *H01L 2224/16245* (2013.01); *H01L 2924/181* (2013.01); *H01L 2924/18161* (2013.01)

(58) Field of Classification Search
CPC .............. H01L 23/495; H01L 23/3675; H01L 23/49568
USPC ....................................... 257/675
See application file for complete search history.

(56) References Cited

U.S. PATENT DOCUMENTS

| | | | |
|---|---|---|---|
| 6,507,120 B2 * | 1/2003 | Lo ................. | H01L 23/3107 257/673 |
| 6,891,256 B2 * | 5/2005 | Joshi ............. | H01L 23/495 257/666 |

(Continued)

*Primary Examiner* — Victoria K. Hall
(74) *Attorney, Agent, or Firm* — Murphy, Bilak & Homiller, PLLC (57) ABSTRACT

A semiconductor chip package includes an electrically conducting carrier and a semiconductor chip disposed over the electrically conducting carrier. The semiconductor chip has a first surface facing the electrically conducting carrier and a second surface opposite the first surface. A metal plate has a first surface mechanically connected to the second surface of the semiconductor chip and a second surface opposite the first surface of the metal plate. The metal plate completely overlaps the second surface of the semiconductor chip. The second surface of the metal plate is at least partially exposed at a periphery of the semiconductor chip package.

13 Claims, 7 Drawing Sheets

(51) Int. Cl.
*H01L 23/498* (2006.01)
*H01L 23/373* (2006.01)

(56) References Cited

U.S. PATENT DOCUMENTS

| | | | | |
|---|---|---|---|---|
| 7,049,684 B2* | 5/2006 | Minamio | H01L 21/565 | 257/666 |
| 7,443,015 B2* | 10/2008 | Punzalan | H01L 23/49503 | 257/673 |
| 7,586,180 B2* | 9/2009 | Hata | H01L 23/49562 | 257/678 |
| 7,768,105 B2* | 8/2010 | Cruz | H01L 24/37 | 257/676 |
| 8,049,312 B2* | 11/2011 | Herbsommer | H01L 24/41 | 257/666 |
| 8,106,501 B2* | 1/2012 | Quinones | H01L 23/49524 | 257/687 |
| 8,193,618 B2* | 6/2012 | Madrid | H01L 23/49524 | 257/670 |
| 8,222,718 B2* | 7/2012 | Jereza | H01L 23/492 | 257/676 |
| 8,304,903 B2* | 11/2012 | Herbsommer | H01L 23/49524 | 257/736 |
| 8,513,784 B2* | 8/2013 | Lu | H01L 23/49524 | 257/666 |
| 9,275,921 B2* | 3/2016 | Miyakawa | H01L 23/28 | |
| 9,570,379 B2* | 2/2017 | Cho | H01L 24/36 | |
| 9,620,475 B2* | 4/2017 | Cho | H01L 23/4334 | |
| 9,653,386 B2* | 5/2017 | Cho | H01L 23/49575 | |
| 2003/0075786 A1* | 4/2003 | Joshi | H01L 24/37 | 257/676 |
| 2004/0063240 A1* | 4/2004 | Madrid | H01L 23/49524 | 438/106 |
| 2005/0161785 A1* | 7/2005 | Kawashima | H01L 23/49562 | 257/678 |
| 2007/0045785 A1* | 3/2007 | Noquil | H01L 24/40 | 257/666 |
| 2007/0145540 A1* | 6/2007 | Mochida | H01L 23/4334 | 257/659 |
| 2007/0161151 A1* | 7/2007 | Madrid | H01L 23/4334 | 438/106 |
| 2007/0267728 A1* | 11/2007 | Noquil | H01L 23/3107 | 257/675 |
| 2007/0267729 A1* | 11/2007 | Otremba | H01L 23/492 | 257/678 |
| 2008/0023807 A1* | 1/2008 | Noquil | H01L 23/3107 | 257/675 |
| 2008/0157300 A1* | 7/2008 | Chuang | H01L 23/3121 | 257/675 |
| 2008/0230928 A1* | 9/2008 | Otremba | H01L 23/49582 | 257/784 |
| 2009/0001532 A1* | 1/2009 | Shiomi | H01L 21/565 | 257/675 |
| 2009/0057855 A1* | 3/2009 | Quinones | H01L 24/40 | 257/676 |
| 2009/0127681 A1* | 5/2009 | Son | H01L 21/565 | 257/675 |
| 2010/0164078 A1* | 7/2010 | Madrid | H01L 23/3107 | 257/675 |
| 2011/0073999 A1* | 3/2011 | Niu | H01L 21/4821 | 257/675 |
| 2012/0175768 A1* | 7/2012 | Saito | H01L 23/49524 | 257/737 |
| 2012/0181677 A1* | 7/2012 | Tsui | H01L 24/40 | 257/675 |
| 2014/0103505 A1* | 4/2014 | Zhao | H01L 24/97 | 257/675 |
| 2014/0110828 A1* | 4/2014 | Otremba | H01L 23/49568 | 257/675 |
| 2014/0159216 A1* | 6/2014 | Ishino | H01L 21/50 | 257/675 |
| 2014/0254103 A1* | 9/2014 | Yoshimi | H05K 7/2089 | 361/719 |
| 2014/0312480 A1* | 10/2014 | Gong | H01L 23/3114 | 257/675 |
| 2015/0076674 A1* | 3/2015 | Miyakawa | H01L 23/49562 | 257/675 |
| 2015/0214138 A1* | 7/2015 | Takagi | H01L 23/28 | 257/675 |
| 2015/0214139 A1* | 7/2015 | Miyakawa | H01L 23/28 | 257/675 |
| 2015/0221582 A1* | 8/2015 | Miyakawa | H01L 23/49524 | 257/676 |
| 2015/0270202 A1* | 9/2015 | Cho | H01L 23/49575 | 257/675 |
| 2015/0311144 A1* | 10/2015 | Williams | H01L 23/4952 | 257/675 |
| 2016/0172281 A1* | 6/2016 | Tsai | H01L 23/49562 | 257/675 |
| 2016/0307826 A1* | 10/2016 | McKnight-Macneil | H01L 29/2003 | |
| 2017/0069563 A1* | 3/2017 | Miyakawa | H01L 24/83 | |

\* cited by examiner

SEMICONDUCTOR CHIP PACKAGE HAVING A COOLING SURFACE AND METHOD OF MANUFACTURING A SEMICONDUCTOR PACKAGE

TECHNICAL FIELD

This disclosure relates generally to the technique of semiconductor device packaging, and in particular to aspects of a semiconductor chip package which offers high power dissipation capabilities.

BACKGROUND

Semiconductor device manufacturers are constantly striving to increase the performance of their products, while decreasing their cost of manufacture. A cost intensive area in the manufacture of semiconductor device packages is packaging the semiconductor chip. The performance of a semiconductor device may be dependent on the heat dissipation capability provided by the package. Further, packaging methods providing semiconductor packages of high thermal robustness at low expense are desirable.

SUMMARY

An aspect of the disclosure relates to a semiconductor chip package. The semiconductor chip package includes an electrically conducting carrier and a semiconductor chip disposed over the electrically conducting carrier. The semiconductor chip has a first surface facing the electrically conducting carrier and a second surface opposite the first surface. A metal plate included in the semiconductor chip package has a first surface mechanically connected to the second surface of the semiconductor chip and a second surface opposite the first surface of the metal plate. The metal plate completely overlaps the second surface of the semiconductor chip. The second surface of the metal plate is at least partially exposed at a periphery of the semiconductor chip package.

An aspect of the disclosure relates to a control unit device. The control unit device includes a substrate. A semiconductor chip package as disclosed herein is mounted on the substrate. The control unit device further includes a housing accommodating the substrate and the semiconductor chip package. The exposed second surface of the metal plate is mechanically connected to a heat sink. The heat sink may, e.g., be a wall of the housing or may be a convection plate contained in the housing.

An aspect of the disclosure relates to a method of manufacturing a semiconductor chip package. The method includes placing a metal plate on a temporary carrier. A semiconductor chip is bonded on the metal plate. An electrically conducting carrier is bonded on the semiconductor chip. The electrically conducting carrier forms a first external terminal of the semiconductor chip package. An encapsulation material is applied to the electrically conducting carrier, the semiconductor chip and the temporary carrier to form an encapsulant. The temporary carrier is then removed from the encapsulant.

BRIEF DESCRIPTION OF THE DRAWINGS

The accompanying drawings are included to provide a further understanding of aspects and are incorporated in and constitute a part of this specification. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference signs may designate corresponding similar parts. It is to be understood that the features of the various examples of embodiments described below may be combined with each other, unless specifically noted otherwise.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

As employed in this specification, the terms "bonded", "attached", "connected", "mounted", "coupled" and/or "electrically connected/electrically coupled" are not meant to mean that the elements or layers must directly be contacted together; intervening elements or layers may be provided between the "bonded", "attached", "connected", "mounted", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "mounted", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "directly on", e.g. in direct contact with, the implied surface. The word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer.

Further, the words "perpendicular" and "parallel" may be used herein with regard to a relative orientation of two or more components. It is understood that these terms may not necessarily mean that the specified geometric relation is realized in a perfect geometric sense. Instead, fabrication tolerances of the involved components may need to be considered in this regard. For example, if two surfaces of an encapsulation material of a semiconductor package are specified to be perpendicular (or parallel) to each other, an actual angle between these surfaces may deviate from an exact value of 90 (or 0) degrees by a deviation value that may particularly depend on tolerances that may typically occur when applying techniques for fabricating a housing made of the encapsulation material.

Semiconductor chip packages described herein include one or more semiconductor chips. In particular, one or more power semiconductor chips may be involved. A semiconductor power chip monolithically integrates one or more semiconductor power devices. One semiconductor power device may, e.g., be one transistor, e.g. one transistor of any of the types recited below.

More specifically, power semiconductor chips may, for example, be configured as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes.

Power semiconductor chip(s) may, e.g., have a vertical structure, that is to say that the semiconductor chip(s) may be fabricated in such a way that electric currents can flow in a direction perpendicular to the main surfaces of the semiconductor chip(s). A semiconductor chip having a vertical structure has electrodes on its two main surfaces, that is to say on its top side and bottom side. By way of example, in vertical devices, the source contact electrode and the gate contact electrode of a power MISFET or a power MOSFET or a power JFET or a HEMT may be situated on one main surface, while the drain contact electrode of the power MISFET or power MOSFET or power JFET or power HEMT may be arranged on the other main surface. Analogously, in bipolar transistor vertical devices, the emitter contact electrode and the gate contact electrode of a power IGBT may be situated on one main surface, while the collector contact electrode of the power IGBT may be arranged on the other main surface. In case of a power diode, the anode contact electrode may be situated on one main surface, while the cathode contact electrode of the power diode may be arranged on the other main surface. Further, it is also possible that the drain (collector) contact electrode and the gate contact electrode are situated on one main surface while the source (emitter) contact electrode is situated on the other main surface.

Semiconductor chip packages containing semiconductor chip(s) having a horizontal structure may be involved. A semiconductor chip having a horizontal structure has chip electrodes only on one of its two main surfaces, e.g. on its active surface. Logic integrated circuit chips as well as power semiconductor chips (e.g. power MISFETs or power MOSFETs or power JFETs or power HEMTs) may have a horizontal structure.

The semiconductor chips may be manufactured from specific semiconductor material such as, for example, Si, SiC, SiGe, GaAs, GaN, AlGaN, InGaAs, InAlAs, etc., and, furthermore, may contain inorganic and/or organic materials that are not semiconductors. The semiconductor chips may be of different types and may be manufactured by different technologies.

The semiconductor chips may have electrodes (chip pads) which allow electrical contact to be made with the integrated circuits included in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or a diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

The semiconductor chip packages described herein include an electrically conducting carrier. The electrically conducting carrier may form a part of a structured metal sheet such as, e.g., a leadframe. The electrically conducting carrier may form a die pad of the structured metal sheet (e.g. leadframe). The structured metal sheet may, e.g., further include at least one terminal pad. The structured metal sheet may be made of any metal or metal alloy, e.g. copper or copper alloy. In other embodiments, the electrically conducting carrier may be made of plastics or ceramics. For instance, the electrically conducting chip carrier may comprise a layer of plastics coated with a metal layer. By way of example, such chip carrier may be a single-layer PCB or a multi-layer PCB. In other embodiments, the electrically conducting carrier may include a sheet of ceramics coated with a metal layer, e.g. a metal bonded ceramics substrate. By way of example, the electrically conducting carrier may be a DCB (direct copper bonded) ceramics substrate.

The semiconductor chip packages described herein include a metal plate. The metal plate may be mechanically, thermally and, e.g., electrically connected to the semiconductor chip. The metal plate may be made of any metal or metal alloy, in particular of metals having a high thermal conductivity and/or a high thermal capacity. By way of example, the metal plate may comprise or be made of copper or a copper alloy. The metal plate may be made of bulk metal material. The metal plate may allow both for effective static heat dissipation and effective dynamic heat dissipation of thermal power loss of the semiconductor chip. This allows to use semiconductor power chips having a high thermal power loss areal density in the semiconductor chip package.

The electrically conducting carrier, the semiconductor chip and, optionally, the metal plate may at least partly be surrounded or embedded in an encapsulating material forming an encapsulant. The encapsulant may form part of the periphery of the semiconductor chip package, i.e. may at least partly define the shape of the semiconductor device.

The encapsulating material may be an electrically insulating material and may comprise or be a thermoset material or a thermoplastic material. A thermoset material may, e.g., be made on the basis of an epoxy resin, a silicone resin or an acrylic resin. A thermoplastic material may, e.g., comprise one or more materials selected from the group of polyetherimide (PEI), polyether-sulfone (PES), polyphenylene-sulfide (PPS), polyamide-imide (PAI), and polyethylene-terephthalate (PET). Thermoplastic materials melt by application of pressure and heat during molding or lamination and (reversibly) harden upon cooling and pressure release.

The encapsulating material may include or be a polymer material, e.g. a duroplastic polymer material. The encapsulating material may include or be at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In particular, the encapsulating material may be a mold material. The encapsulating material may then be applied over the semiconductor chip, the electrically conducting carrier and, optionally, the metal plate by molding. Various techniques such as, e.g., compression molding, injection molding, powder molding, liquid molding, transfer molding or film-assisted molding (FAM) may be used to form the encapsulant.

The semiconductor package described herein may be a leaded package or a leadless package. Leads may protrude out of the encapsulant to form external terminals of the semiconductor chip package. That is, one or more embodiments of the semiconductor chip package described herein may comprise a leaded chip carrier (LCC), in particular a leadframe, configured for surface mount technology (SMT).

A variety of different types of electronic devices may be configured to use a semiconductor chip package as described herein. By way of example, an electronic device in accordance with the disclosure may constitute, e.g., an engine control unit (ECU), a power supply, a DC-DC voltage converter, an AC-DC voltage converter, a power amplifier, and many other devices, in particular power devices.

In general, any power device comprising a semiconductor power chip having a high thermal power loss and a comparatively small footprint area to dissipate the thermal power may benefit from the disclosure herein. By way of example, semiconductor power chips having, in operation, a thermal power loss of equal to or greater than, e.g., 1 W, 3 W, 5 W, 7 W, 10 W, 15 W, 20 W and, e.g., and a footprint area for thermal power dissipation equal to or less than 25 $mm^2$, 20 $mm^2$, 15 $mm^2$, 10 $mm^2$, 7 $mm^2$, 5 $mm^2$, 3 $mm^2$ may use a metal block as described herein for improving thermal behavior and power dissipation during operation.

Figure 1A:
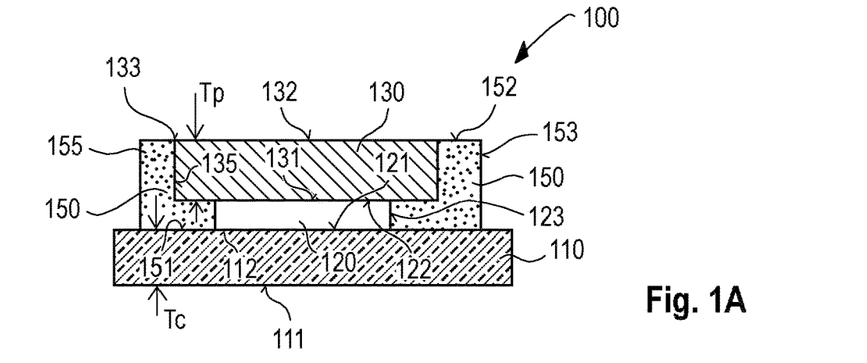
FIG. 1A is a cross-sectional view of an example of a semiconductor chip package 100 along line A-A in FIG. 1B.
Figure 1B:
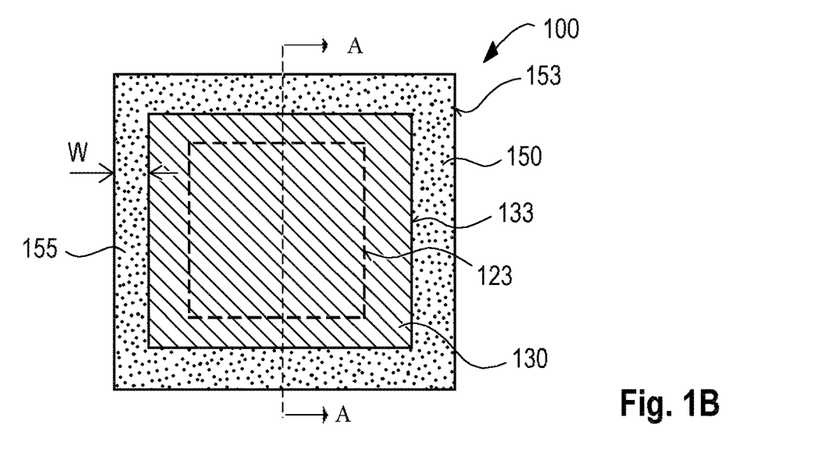
FIG. 1B is a top view of the exemplary semiconductor chip package 100 of FIG. 1A.

FIGS. 1A and 1B illustrate a cross-sectional view and a top view, respectively, of an exemplary semiconductor chip package 100. The semiconductor chip package 100 includes an electrically conducting carrier 110, a semiconductor chip 120 and a metal plate 130. Further, the semiconductor chip package 100 may include an encapsulant 150 embedding at least partially the electrically conducting carrier 110, the semiconductor chip 120 and, optionally, the metal plate 130.

As apparent from FIG. 1A, the metal plate 130 has a first (bottom) surface 131 which may mechanically connect or be bonded to a second (upper) surface 122 of the semiconductor chip 120. A first (bottom) surface 121 of the semiconductor chip 120 opposite the second surface 122 faces the electrically conducting carrier 110 and may, e.g., be bonded to the electrically conducting carrier 110 by a bonding material (not shown). A second (upper) surface 132 of the metal plate 130 opposite the first surface 131 is at least partially exposed at a periphery of the semiconductor chip package 100.

As shown in FIG. 1B, an outline 133 of the metal plate 130 encloses an outline 123 of the semiconductor chip 120. In other words, the metal plate 130 completely overlaps the second surface 122 of the semiconductor chip 120. Further, an outline 153 of the (optional) encapsulant 150 may enclose the outline 133 of the metal plate 130. An outline of the electrically conducting carrier 110 is not depicted in FIG. 1B.

A thickness of the electrically conducting carrier 110 is denoted by Tc. Tc as measured between a first (bottom) surface 111 and a second (upper) surface 112 of the electrically conducting carrier 110 may, e.g., be equal to or greater than 0.1 mm, 0.2 mm, 0.3 mm, 0.5 mm. Tc may be equal to or less than 0.7 mm, 0.5 mm, 0.4 mm, 0.3 mm, 0.2 mm, or 0.1 mm.

A thickness of the metal plate 130 is denoted by Tp. Tp is measured between the first and second surfaces 131, 132 of the metal plate 130. Tp may, e.g., be equal to or greater than 0.3 mm, 0.4 mm, 0.5 mm, 0.6 mm, 0.7 mm, or 0.8 mm. In particular, Tp may be equal to or greater than 1.0, 1.25, 1.5, 1.75, or 2.00 times Tc.

An area size of the exposed second surface 132 of the metal plate 130 may be equal to or greater than 20 $mm^2$, 25 $mm^2$, 30 $mm^2$ or 35 $mm^2$. The greater the area size the easier it is to remove heat generated by the semiconductor chip 120 from the semiconductor chip package 100.

The encapsulant 150 may, e.g., provide for at least one frame portion 155 which covers at least one side face 135 of the metal plate 130. In FIGS. 1A-1B the encapsulant 150 has a frame portion which, e.g., completely surrounds or encloses the metal plate 130. A width W of the frame portion 155, as measured in a direction perpendicular to the height (thickness) direction of the semiconductor chip package 100, may be equal to or less than 0.5 mm, 0.4 mm, 0.3 mm, 0.2 mm or 0.1 mm.

Efficient cooling of the semiconductor chip package 100 may be promoted when a ratio of an area size of the exposed second surface 132 of the metal plate 130 (e.g. the area enclosed by the outline 133) and an area size as defined by the outline 153 of the encapsulant 150 is equal to or greater than 0.7, 0.8, 0.85 or 0.9. The greater the ratio the better is the cooling capability of the semiconductor chip package 100 in terms of lateral package dimensions (e.g. as expressed by the package footprint area).

As shown in FIG. 1A, a first (bottom) surface 151 of the encapsulant 150 may abut the second surface 112 of the electrically conducting carrier 110. A second (upper) surface 152 of the encapsulant 150 may, e.g., level with the exposed second surface 132 of the metal plate 130.

The metal plate 130 provides for a top side cooling facility of the semiconductor chip package 100. Top side cooling allows to efficiently remove, e.g., most of the heat generated in the package 100 via the exposed second surface 132 of the metal plate 130, thus reducing the demand of high heat removal capacity via the electrically conducting carrier 110.

More specifically, the thermal power generated in the semiconductor chip 120 must be drained in order to avoid overheating, degradation or breakdown of the semiconductor power chip 120. The metal plate 130 provides both for an improved stationary thermal power dissipation and for an improved dynamic thermal power dissipation. Stationary thermal power is produced continuously in the semiconductor chip 120 during operation and, therefore, has to be continuously conducted away from the semiconductor chip 120. As the metal plate 130 completely overlaps the second surface 122 of the semiconductor chip 120, a heat flow interface of maximum size is offered by the metal plate 130 to the semiconductor chip 120. This large size transition area for heat dissipation between the semiconductor chip 120 and the metal block 130 and the large area heat flow interface offered by the exposed second surface 132 of the metal plate 130 allow for continuous and efficient heat removal. Stated differently, the metal plate 130 may be regarded as a "heat spreader" shaped to provide for a minimum thermal resistance between the location of heat generation (i.e. power loss in the semiconductor chip 120) and the outside of the semiconductor chip package 100.

Dynamic thermal power dissipation relates to fluctuations in the generation of thermal power in the semiconductor chip 120. The thermal power generated in the semiconductor chip 120 is time-variant. Time variance may, e.g., be caused by the time-variant operation of the semiconductor chip 120 or a time-variant operation of a load connected thereto or both.

Dynamic thermal power dissipation is combated by the heat capacity of the metal plate 130, which is tightly coupled to the semiconductor chip 120 by the aforementioned semiconductor chip 120 to metal plate 130 interface. The heat capacity of the metal plate 130 provides for a short-time heat storage facility. The storage of heat from dynamic dissipation in the metal plate 130 provides for a temporary cooling of the semiconductor chip 120. In other words, the metal plate 130 adds an effective heat capacity to the heat capacity of the semiconductor chip 120, which prevents short-time power loss peaks from overheating the semiconductor chip 120.

The greater the mass of the metal plate 130 and the lower the thermal resistance of the thermal interface between the semiconductor chip 120 and the metal plate 130, the better is the dynamic thermal power dissipation efficiency of the semiconductor chip package 100.

Figure 2A:
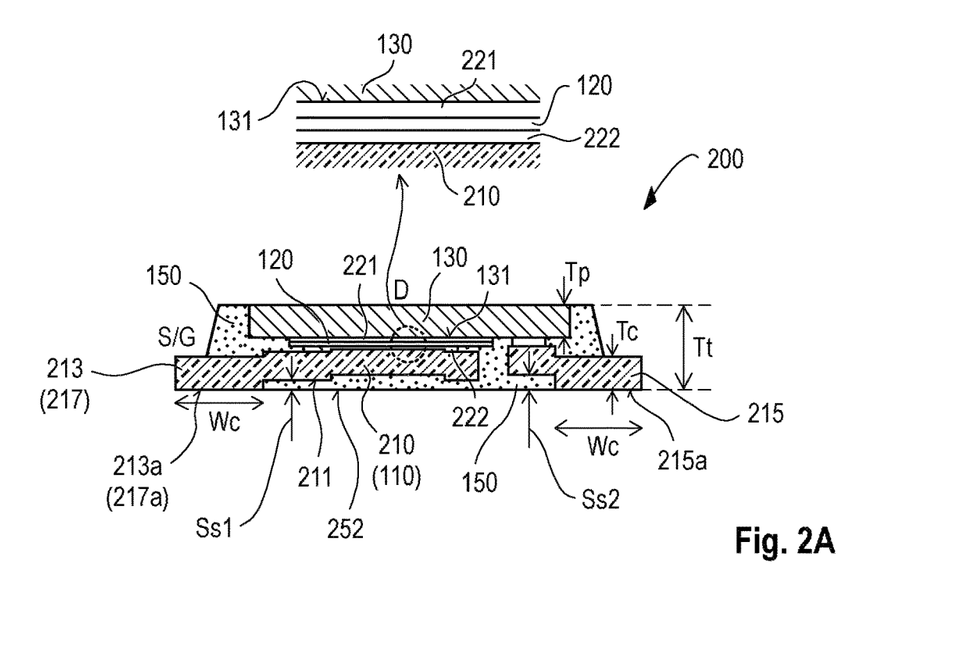
FIG. 2A is a cross-sectional view of an example of a semiconductor chip package 200 along line A-A in FIG. 2B.
Figure 2B:
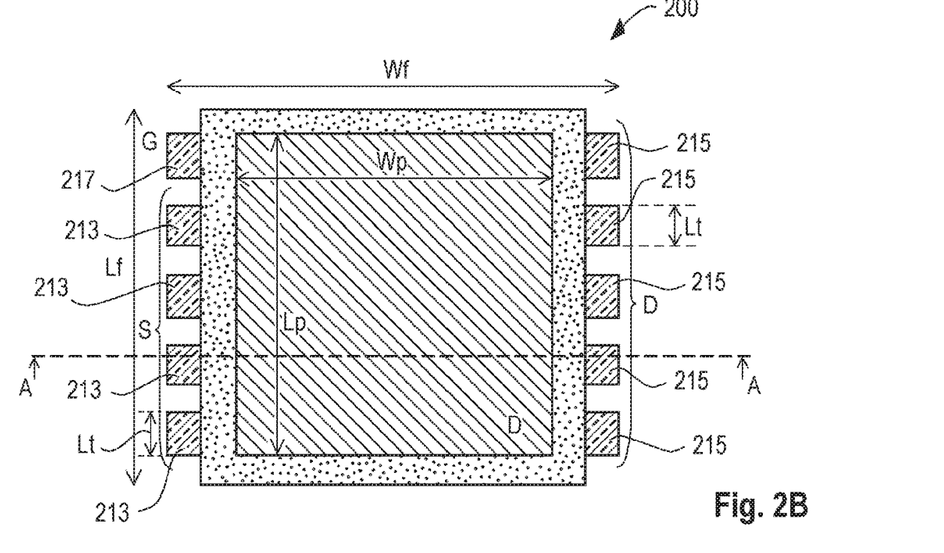
FIG. 2B is a top view of the exemplary semiconductor chip package 200 of FIG. 2A.
Figure 2C:
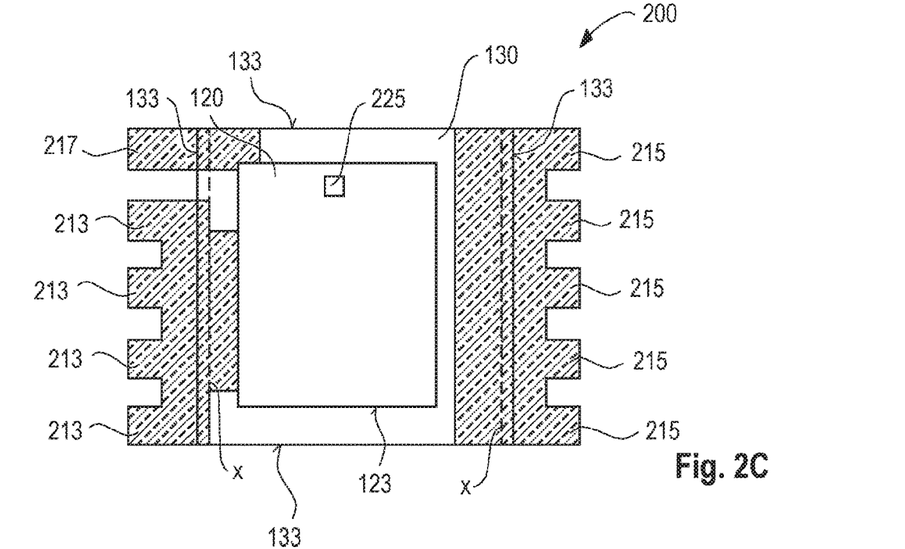
FIG. 2C is a top transparent view of the exemplary semiconductor chip package 200 of FIG. 2A without encapsulant applied.

FIGS. 2A, 2B and 2C illustrate an exemplary semiconductor chip package 200. All features including dimensions, materials and other quantities and characteristics recited above for the semiconductor chip package 100 may apply to the semiconductor chip package 200, and vice versa. However, semiconductor chip package 200 provides more detailed features which may selectively be combined with features of other embodiments.

In semiconductor chip package 200 the electrically conducting carrier 110 is implemented by a die pad 210 of a structured metal sheet, e.g. a leadframe. The structured metal sheet or leadframe may further include at least one terminal pad.

The die pad 210 (which corresponds to the electrically conducting carrier 110) may form a first external terminal 213 of the semiconductor chip package 200. As illustrated in FIGS. 2A-2C, the first external terminal 213 may be implemented by a lead contact area 213a exposed at the bottom of the semiconductor chip package 200.

The terminal pad may form a second external terminal 215 of the semiconductor chip package 200. A lead contact area 215a of the second external terminal 215 may be exposed at the bottom of the semiconductor chip package 200.

Further, the structured metal sheet (e.g. leadframe) may comprise another terminal pad which may form a third external terminal 217 of the semiconductor chip package 200. The third external terminal 217 may comprise a lead contact area 217a exposed at the bottom of the semiconductor chip package 200.

By way of example, the semiconductor chip 120 may include a first (bottom) load electrode (not shown) arranged at the first (bottom) surface 121 of the semiconductor chip 120. The first load electrode may be mechanically and electrically connected to the die pad 210. Thus, the first external terminal 213 may directly connect to the first load electrode of the semiconductor chip 120. By way of example, the first load electrode may be the source S (or emitter) electrode of the semiconductor power device integrated in the semiconductor chip 120.

The semiconductor chip 120 may have a second load electrode (not shown) arranged at the second (upper) surface 122 of the semiconductor chip 120. The second load electrode may be mechanically and electrically connected to the first (bottom) surface 131 of the metal plate 130. By way of example, the second load electrode of the semiconductor chip 120 may be the drain D (or collector) electrode of the semiconductor power device integrated in the semiconductor chip 120.

The terminal pad forming the second external terminal 215 may be electrically and mechanically connected to the metal plate 130, e.g. to the first (bottom) surface 131 of the metal plate 130. That way, the second external terminal 215 is connected to the second load electrode (not shown) of the semiconductor chip 120 via the metal plate 130.

Further, the semiconductor chip 120 may include a control electrode 225 arranged, e.g., at the first (bottom) surface 121 of the semiconductor chip 120. The control electrode 225 (e.g. gate G) may be mechanically and electrically connected to the terminal pad forming the third external terminal 217 of the semiconductor chip package 200. The third external terminal 217 may, e.g., be connected via a clip (not shown), a ribbon bond or a wire bond to the control electrode 225 of the semiconductor chip 120.

The semiconductor chip package 200 may have a footprint of width Wf and length Lf. The second surface 132 of the metal plate 130 may have an exposed area of width Wp and length Lp. Further, the total thickness of the semiconductor chip package 200 may be denoted by Tt and the width of the lead contact areas 213a, 215a, 217a exposed at the bottom of the semiconductor chip package 200 may be denoted by Wc. Still further, Ss1 denotes a first step size as measured between a first (bottom) surface 211 of the die pad 210 and a second (bottom) surface 252 of the encapsulant 150 and Ss2 denotes a second step size as measured between the bottom surface of the second external terminal 215 and the second surface 252 of the encapsulant 150. Still further, Lt denotes the length of a lead of the first external terminal 213, the second external terminal 215 and/or the third external terminal 217. Further, the dashed lines X in FIG. 2C indicate the locations of the steps at the first external terminal 213, the second external terminal 215 and the third external terminal 217 or, in other words, enclose an area at the bottom of the semiconductor chip package 200 which is covered by the encapsulant 150 (e.g. as represented by the second surface 252 of the encapsulant 150 which is not shown in the transparency view of FIG. 2C).

Possible dimensions of the semiconductor chip package 200 are Wf=8.0 mm, Lf=7.0 mm, Wp=5.5 mm, Lp=6.0 mm, We=1.50 mm, Tt=1.31 mm, Tp=0.50 mm, Tc=0.50 mm, Ss1=0.9 mm, Ss2=0.25 mm, Lt=0.8 mm. The semiconductor chip package 200 of, e.g., these dimensions provides for a top side cooling area of the exposed second (upper) surface 132 of the metal plate 130 of 33 mm$^2$.

It is to be noted that the above values are exemplary values subject to variations. Each of the values may, e.g., be individually variable by ±10%, ±20%, ±30%, ±40%, ±50%, wherein all combinations of values varied within these ranges are understood to be disclosed herein.

The thickness of the semiconductor chip 120 may, e.g., be equal to or less than or greater than 0.01 mm, 0.02 mm, 0.03 mm, 0.04 mm, 0.05 mm, 0.06 mm, 0.07 mm, 0.08 mm. Further, the semiconductor chip 120 may be bonded by bonding layers 221 and 222 to the metal plate 130 and the die pad 210 (electrically conducting carrier 110), respectively. The bonding layers 221, 222 may be solder layers having, e.g., a thickness of equal to or less than or greater than 0.01 mm, 0.02 mm, 0.03 mm, 0.04 mm, 0.05 mm, 0.06 mm.

It is to be noted that the thickness Tp of the metal plate and, as a result, the thickness Tt of the semiconductor chip package 200 may be varied in accordance with the heat dissipation characteristics required. Therefore, it may be possible that the ratio of Tp/Tt is equal to or greater than, e.g., 0.3, 0.4, 0.5, 0.6, 0.7.

Further, it is to be noted that all external terminals of the semiconductor chip package 200 may, e.g., be located at the bottom of the semiconductor chip package 200 and/or that all external terminals may, e.g., be arranged only at two of the four sides of the semiconductor chip package 200 and/or that the pitch of the leads of the external terminals 213, 215 and 217 may be equidistant.

Figure 3:
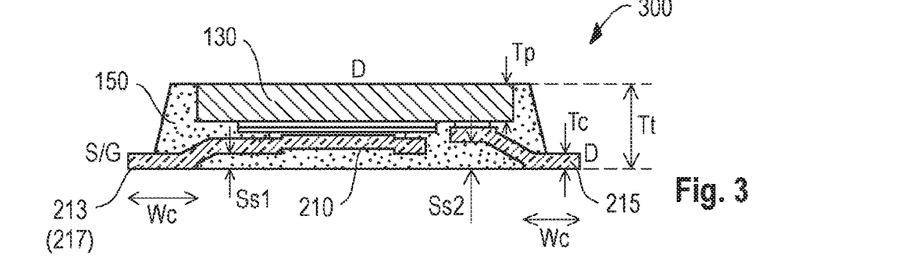
FIG. 3 is a cross-sectional view of an example of a semiconductor chip package 300 along line A-A in FIG. 2B showing a smaller thickness of the electrically conducting carrier.

FIG. 3 illustrates a cross-sectional view of an exemplary semiconductor chip package 300. The semiconductor chip package 300 may be identical with the semiconductor chip package 200 except that the structured metal sheet or leadframe (i.e. the die pad 210/first terminal pad 213 and the second and third terminal pads 215, 217) may be reduced in thickness, and other dimensions be adapted. By way of example, We=1.00 mm, Tc=0.25 mm, Ss1=0.30 mm, Ss2=0.36 mm and Tt=1.17 mm, while the other dimensions, as mentioned for semiconductor chip package 200, may remain the same. Again, each of the dimensions are individually subject to variations as outlined above.

Figure 4A:
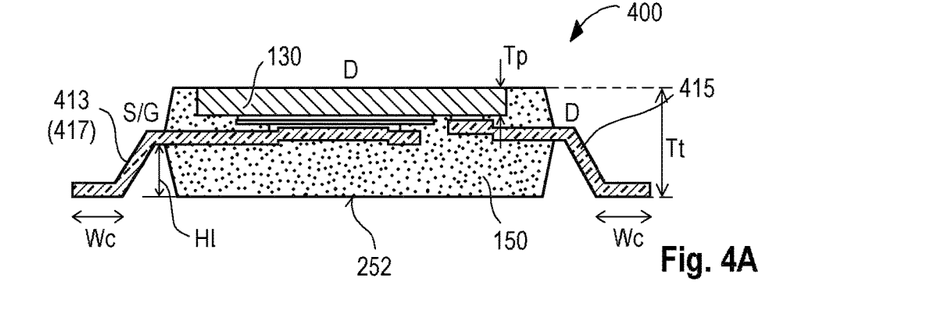
FIG. 4A is a cross-sectional view of an example of a semiconductor chip package 400 showing a gullwing package type.
Figure 4B:
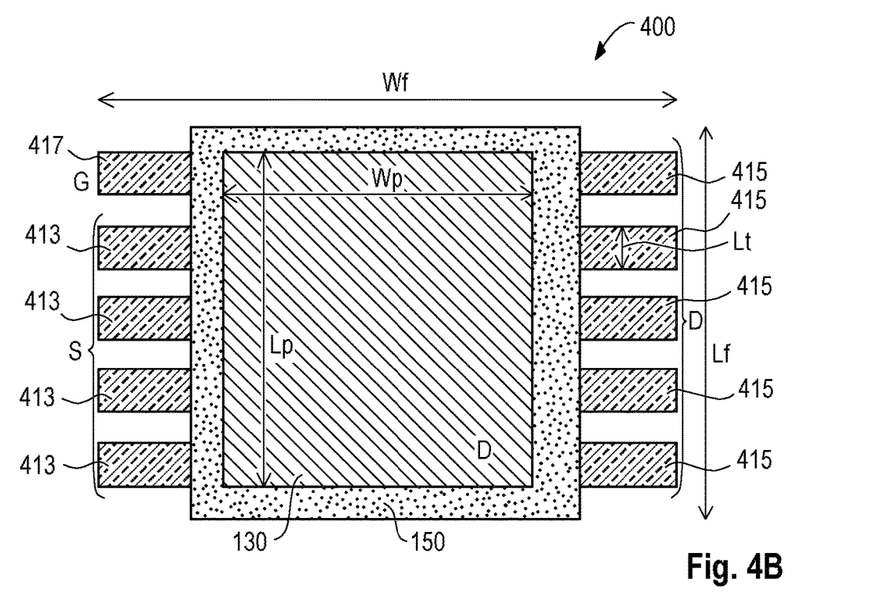
FIG. 4B is a top view of the exemplary semiconductor chip package 400 of FIG. 4A.

FIGS. 4A and 4B illustrate a gullwing type semiconductor chip package 400. In contrast to semiconductor chip packages 200, 300, the gullwing type semiconductor chip package 400 does not have external terminals arranged at the bottom of the encapsulant 150. Rather, first, second and third external terminals 413, 415, 417 are designed by leads protruding out of the encapsulant 150 at height Hl. The external terminal leads are bent down to the level of the bottom (corresponding to the second surface 252 of the encapsulant 150) of the semiconductor chip package 400 in order to provide for a SMD (surface mounted device) capability of the semiconductor chip package 400.

Possible dimensions of the semiconductor chip package 400 are Hl=1.00 mm, We=1.0 mm, Tt=1.87 mm, Wf=10.5 mm, Lf=7.0 mm, and the residual dimensions, e.g., identical with the dimensions quoted above. Again, variations of the values within the above ranges or outside thereof are possible.

The gullwing type package feature, in combination with the top side cooling heat spreader (metal plate 130), allows for handling high thermal power losses in combination with high package mounting reliability, because the leads of the external terminals of the semiconductor chip package 400 provide for enhanced mechanical flexibility and therefore higher contact reliability during power operation, while the lower thermal conductivity of the gullwing type external terminal leads may be compensated by the advanced top side cooling feature of the metal plate 130.

Figure 5:
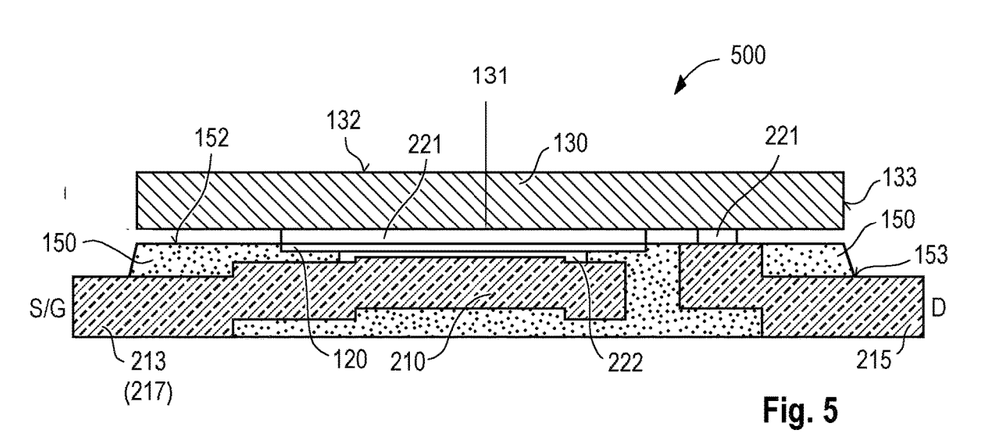
FIG. 5 is a cross-sectional view of an example of a semiconductor chip package 500 showing exposed side face(s) of the metal plate.
Figure 6:
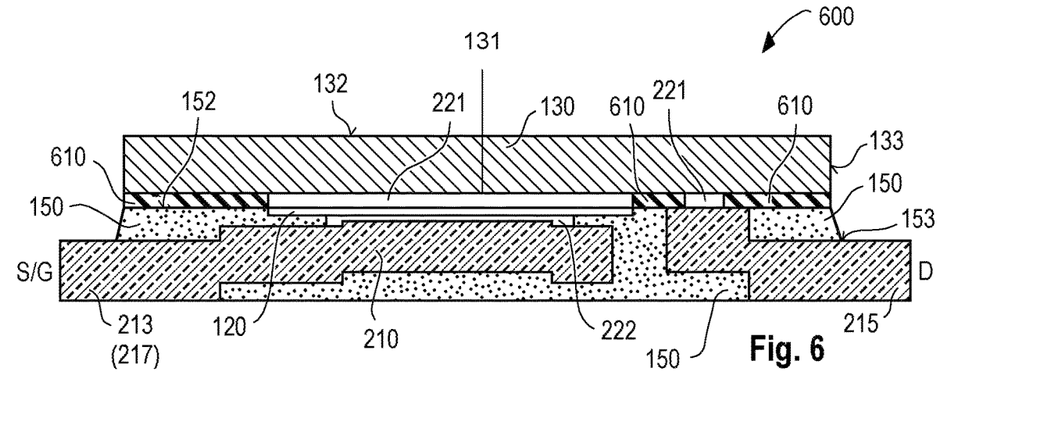
FIG. 6 is a cross-sectional view of an example of a semiconductor chip package 600 showing a filler arranged between the metal plate and the encapsulant.

FIGS. 5 and 6 illustrate cross-sectional views of semiconductor chip packages 500 and 600, respectively. The semiconductor chip packages 500, 600 may be similar or identical to semiconductor chip package 200 except that the encapsulant 150 does not embed the metal plate 130. More specifically, some or all side faces of the metal plate 130 may be exposed from the encapsulant 150. Further, also the first surface 131 of the metal plate 130 may be exposed from the encapsulant 150.

This allows the dimension Lp, Wp (see e.g. FIG. 2B) of the metal plate 130 to equal or exceed the corresponding dimensions of the encapsulant 150. In other words, the ratio of an area size of the exposed second surface 132 of the metal plate 130 and an area size as defined by the outline 153 of the encapsulant 150 may, e.g., exceed 0.9, 0.95, or may even be equal to or greater than 1.0. Apart from this, all features including dimensions, materials and other quantities and characteristics recited above for the semiconductor chip packages 100, 200, 300 and 400 may apply to the semiconductor chip packages 500 and 600, respectively, and vice versa, and reference is made to the description above in order to avoid reiteration.

As shown in FIG. 6, the semiconductor chip package 600 further includes a filler material 610 arranged between the first (bottom) surface 131 of the metal plate 130 and the second (upper) surface 152 of the encapsulant 150. The filler material 610 may be an electrically insulating polymer material which seals the gap between the metal plate 130 and the encapsulant 150 to provide for protection against environmental attack.

Figure 7:
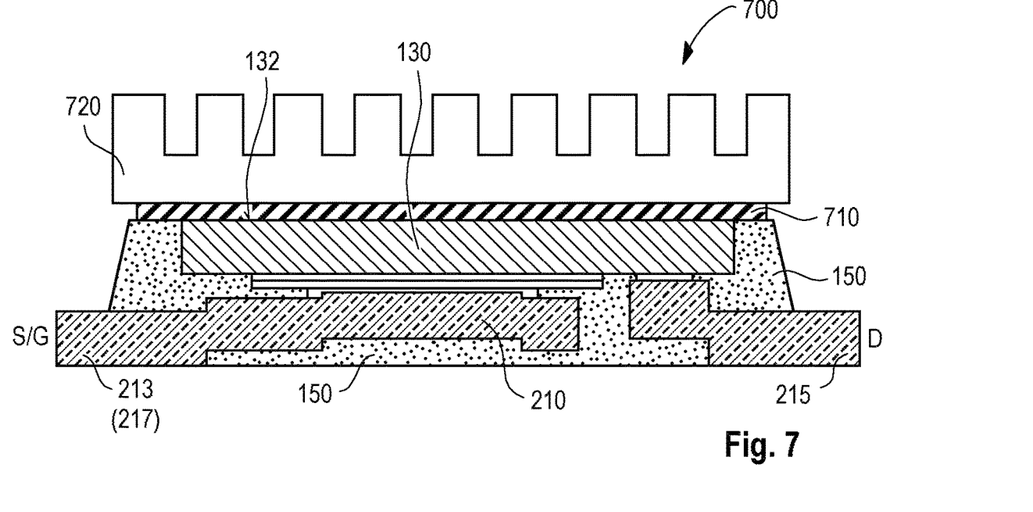
FIG. 7 is a cross-sectional view of an example of a semiconductor chip package 700 showing a heat sink attached to the metal plate.

FIG. 7 illustrates a cross-sectional view of an exemplary semiconductor chip package 700. The semiconductor chip package 700 may be identical to semiconductor chip packages 100, 200, 300, 400, 500, 600 except that a heat sink 720 is mechanically fixed onto the exposed second (upper) surface 132 of the metal plate 130 and, e.g., also to the second (upper) surface 152 of the encapsulant 150 by an electrically insulating material 710. The electrically insulating material 710 may have high thermal transfer properties, i.e. may provide for a low thermal resistance in order to support heat transfer from the metal plate 130 to the heat sink 720. The heat sink 720 may be a metal structure which may, e.g., be shaped as a radiator. The electrically insulating material 710 may, e.g., include or be a polymer material or a ceramic material or a mixture thereof.

Figure 8:
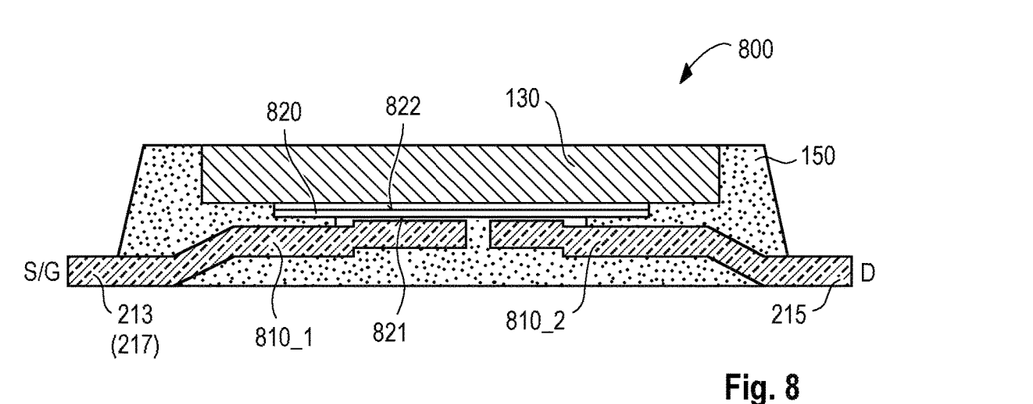
FIG. 8 is a cross-sectional view of an example of a semiconductor chip package 800 showing a horizontal device semiconductor chip.

FIG. 8 illustrates a cross-sectional view of an exemplary semiconductor chip package 800. Semiconductor chip package 800 may be identical or similar to aforementioned semiconductor chip packages 100-700 with the exception that a horizontal device semiconductor chip 820 is implemented in the package. All chip electrodes of the semiconductor chip 820 may be arranged at the first (bottom) surface 821 of the semiconductor chip 820. The second (upper) surface 822 of the semiconductor chip 820 opposite the first surface 821 may be void of any chip electrodes.

The electrically conducting carrier 810 corresponding to carrier 110 may comprise a first die pad 810_1 and a second die pad 810_2 which are electrically insulated from each other. The first die pad 810_1 (corresponding to die pad 210) may be bonded to a first load electrode (not shown) of the semiconductor chip 820 and may connect to a first external terminal 213, and the second die pad 810_2 may be bonded to a second load electrode (not shown) of the semiconductor chip 820 and may connect to a second external terminal 215. A control electrode (not shown) may be connected to a third external terminal as, e.g., illustrated at reference sign 217 in FIG. 2C. In contrast to other semiconductor chip packages described herein, the metal plate 130 does not need to have an electrical function, namely does not need to conduct a load electrode current. Further, it is to be noted that no electrically insulating material 710 is needed if, e.g., a heat sink 720 (see FIG. 7) is coupled to the semiconductor chip package 800. Nevertheless, as the metal plate 130 may have the same thermal functionality as in the other semiconductor chip packages 100-700, all features as recited above may similarly apply to the semiconductor chip package 800.

Figure 9:
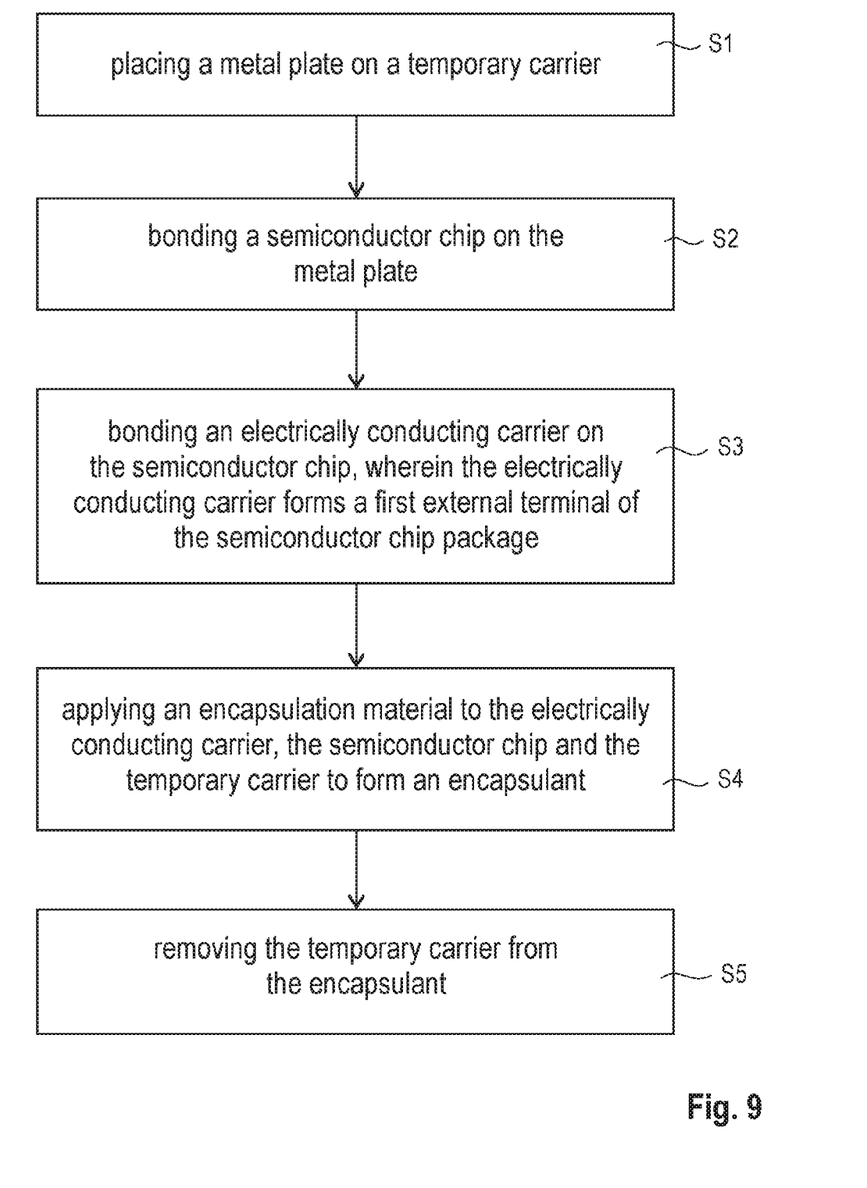
FIG. 9 is a flow diagram illustrating stages of an exemplary method of manufacturing a semiconductor chip package in accordance with the disclosure.
Figure 10A:
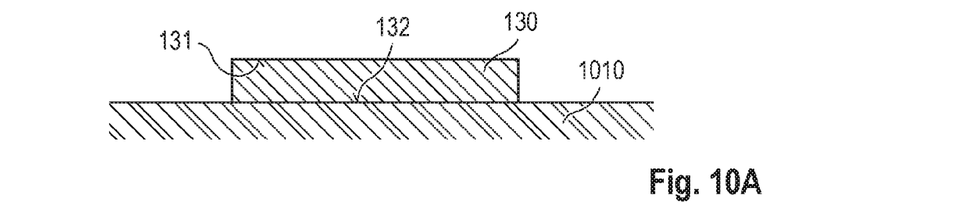
FIGS. 10A-10F schematically illustrate cross-sectional views of stages of an exemplary method of manufacturing a semiconductor chip package in accordance with the disclosure.

FIG. 9 and FIGS. 10A-10F illustrate exemplary stages of a method of manufacturing a semiconductor chip package as, e.g., described above. At S1 of FIG. 9 and as illustrated in FIG. 10A, a metal plate 130 is placed on a temporary carrier 1010. The metal plate 130 may be placed on the temporary carrier 1010 with the second surface 132 facing the temporary carrier 1010.

Figure 10B:
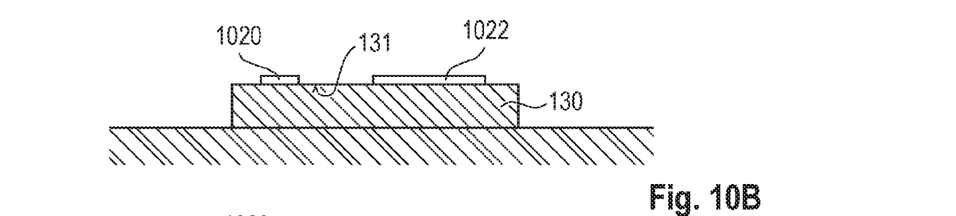

As illustrated in FIG. 10B, bonding layers 1020, 1022 may be applied to the first surface 131 of the metal plate 130. The bonding layers 1020, 1022 may be of solder, e.g. soft solder, hard solder, diffusion solder, sintered metal and/or an electrically conducting adhesive.

Figure 10C:
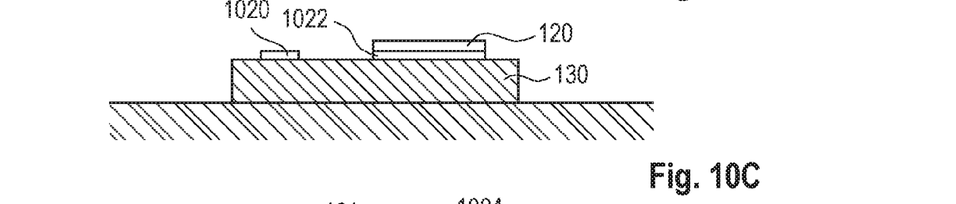

At S2 (FIG. 9) a semiconductor chip 120 is bonded on the metal plate 130. More specifically, as illustrated in FIG. 10C, the semiconductor chip 120 may be bonded to the bonding layer 1022. As mentioned above, a drain (collector) electrode or a source (emitter) electrode of the semiconductor chip 120 may be electrically and mechanically connected to the bonding layer 1022.

Figure 10D:
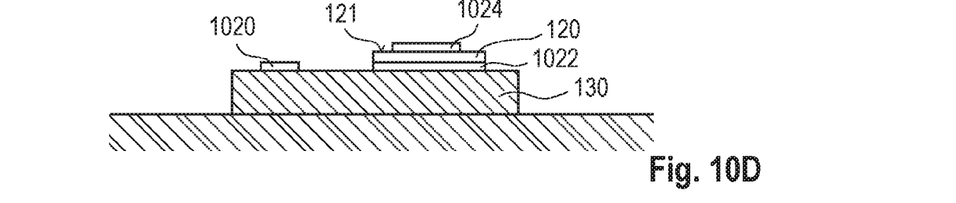

At S3 an electrically conducting carrier 110 is bonded on the semiconductor chip 120, wherein the electrically conducting carrier 110 is configured to form a first external terminal 213 of the semiconductor chip package to be manufactured. Referring to FIG. 10D, a bonding layer 1024 may be applied to the first surface 121 of the semiconductor chip 120, e.g. to a load electrode situated at the first surface 121.

Figure 10E:
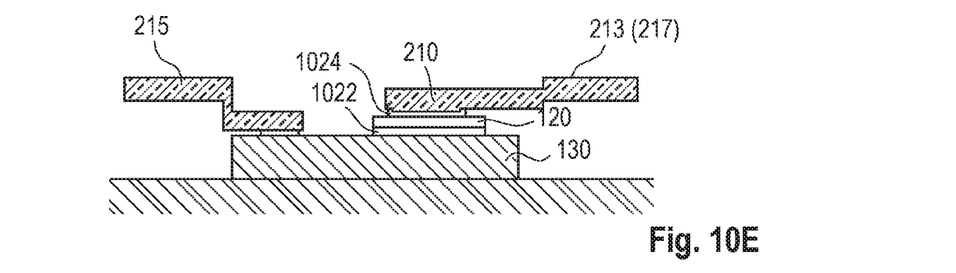

FIG. 10E illustrates the process of bonding the electrically conducting carrier 110, e.g. die pad 210 of a leadframe, on the semiconductor chip 120. Simultaneously the terminal pad 215 may be bonded on the metal plate 130 via the bonding layer 1020. It is to be noted that at this time the die pad 210 and the terminal pad 215 may be connected to each other by tie bars or bridges (not shown) of the leadframe.

As apparent to a person skilled in the art, the leadframe (die pad 210, terminal pad 215) is bonded to the underlying structure similar to the way as clip bonding is used in conventional package built-up processes. Therefore, the die pad 210 of the leadframe virtually has the function of a clip as used for load electrode (e.g. source) and control electrode (e.g. gate) bonding. On the other hand, the metal plate 130, which serves as a heat spreader and allows for top side cooling in the finalized semiconductor chip package 100-800, virtually assumes the role of a leadframe as used in conventional package built-up processes.

Figure 10F:
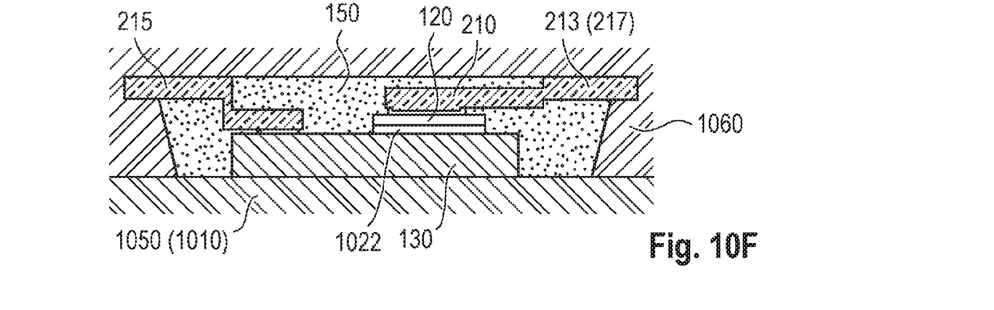

At S4 in FIG. 9 an encapsulation material is applied to the electrically conducting carrier, the semiconductor chip and the temporary carrier to form an encapsulant. An example of this process is illustrated in FIG. 10F. Various techniques may be employed to cover the electrically conducting carrier 110, the semiconductor chip 120 and the temporary carrier 1010 with encapsulation material. By way of example, molding processes such as compression molding, injection molding, powder molding, liquid molding, transfer molding and/or film-assisted molding (FAM) may be used.

An upper mold half 1060 may be moved down onto a lower mold half 1050, which may, e.g., be formed by the temporary carrier 1010. Then the encapsulation material (molding material) is introduced into the cavity formed between the upper mold half 1060 and the lower mold half 1050. This process may be accompanied by the application of heat and pressure. After curing, the encapsulation material is rigid and forms the encapsulant 150.

It is to be noted that the molding process (FIG. 10F) in this manufacturing method may be very inexpensive because a conventional transfer molding process may be used rather than more complicated technologies such as film-assisted molding (FAM) processes. As known in the art, expensive FAM needs often to be used since it offers a number of advantages over conventional transfer molding (without film-assist). However, in the molding process described herein the large size metal plate 130 may directly abut to the lower mold half 1050 (or temporary carrier 1010) to keep the second surface 132 of the metal plate 130 exposed from encapsulation material. Therefore, no film (i.e. FAM technology) is needed at least at the temporary carrier 1010 or the lower mold half 1050, which may save substantial costs in package manufacturing.

At S5, the temporary carrier 1010 is removed from the encapsulant 150. To that end, the cavity formed between the upper mold half 1060 and the lower mold half 1050 may be opened and the semiconductor chip package may be removed.

Figure 11:
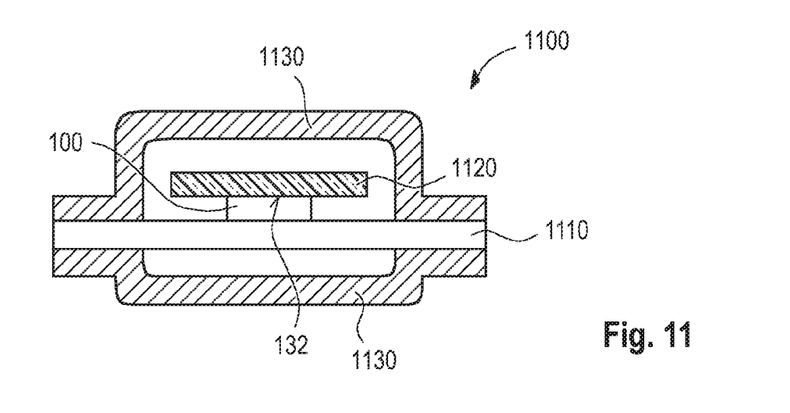
FIG. 11 is a cross-sectional view of an example of a control unit device 1100 including a semiconductor chip package accommodated in a housing and coupled to a convection plate within the housing.

FIG. 11 illustrates a cross-sectional view of an exemplary control unit device 1100, e.g. an engine control unit (ECU). The control unit device 1100 includes a substrate 1110 such as, e.g., a PCB (printed circuit board). A semiconductor chip package 100, e.g. one of the packages described above, is mounted on the substrate 1110 by, e.g., SMD technology. The exposed second surface 132 of the metal plate is mechanically connected to a heat sink 1120. The heat sink may, e.g., be a convection plate which is contained in a housing 1130 together with the substrate 1110 and the semiconductor package 100.

The housing 1130 may include or be of plastic. The housing 1130 may not have any mechanical contact to the heat sink 1120. Rather, the heat transferred from the semiconductor chip package 100 to the heat sink 1120 is removed from the heat sink 1120 by convection.

Figure 12:
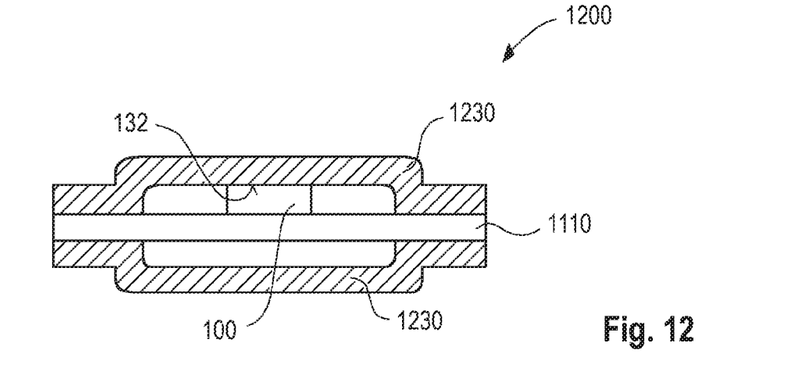
FIG. 12 is a cross-sectional view of an example of a control unit device 1200 including a semiconductor chip package accommodated in a housing and coupled to the wall of the housing.

In the control unit device 1200 (e.g. ECU) of FIG. 12, the exposed second surface 132 of the metal plate 130 may be mechanically connected to a wall of a housing 1230. In this case, the wall of the housing 1230 acts as a heat sink to remove the heat from the metal plate 130 by solid state heat conduction. The housing 1230 of the control unit device 1200 or at least the wall used for thermal conduction may be made of metal, e.g. aluminum or any other appropriate metal.

It is to be noted that in control unit devices 1100 and 1200 cooling is done only to a small extent via the substrate 1110. Therefore, thermal vias and/or Cu inlays in the substrate 1110 or thermal interfacial material (TIM) between the substrate 1110 and the housings 1130, 1230 such as used in conventional ECUs are not needed in control unit device 1100, 1200. Therefore, the space on the substrate 1110 (e.g. PCB) used for thermal reasons (consumed by thermal vias, thicker Cu inner layers or inlays) as well as the costs associated with such highly thermally conductive substrates may be saved. The "direct cooling" approach in combination with the top side exposed surface of a massive heat spreader (metal plate 130) allows thermally bypass of the high thermal resistance (Rth) of the substrate and thus overcomes the shortcomings of conventional substrate-based cooling approaches.

More specifically, the SMD semiconductor chip packages with top side cooling capability for direct cooling as disclosed herein allow to separate the electrical path (via substrate 1110) and the thermal path (via exposed second surface 132 of metal plate 130) from each other. As a result, low Ron values and low inductances from package side may be obtained. Further, the ratio of chip size and package footprint area may be increased, e.g. chip sizes of equal to or more than 10 mm$^2$, 11 mm$^2$, 12 mm$^2$, 13 mm$^2$, 14 mm$^2$, 15 mm$^2$ may be enabled in, e.g., a 7 mm×8 mm semiconductor chip package outline. Further, the concept of a "leadframe clip" (see e.g. FIG. 10E) enables high current capability of the semiconductor chip packages 100-800 disclosed herein.

The following examples pertain to further aspects of the disclosure:

Example 1 is a semiconductor chip package, including an electrically conducting carrier; a semiconductor chip disposed over the electrically conducting carrier, wherein the semiconductor chip has a first surface facing the electrically conducting carrier and a second surface opposite the first surface; and a metal plate having a first surface mechanically connected to the second surface of the semiconductor chip and a second surface opposite the first surface of the metal plate, wherein the metal plate completely overlaps the second surface of the semiconductor chip, and the second surface of the metal plate is at least partially exposed at a periphery of the semiconductor chip package.

In Example 2, the subject matter of Example 1 can optionally include wherein the semiconductor chip comprises a first load electrode arranged at the first surface of the semiconductor chip, the first load electrode is mechanically and electrically connected to the electrically conducting carrier, the electrically conducting carrier forming a first external terminal of the semiconductor chip package.

In Example 3, the subject matter of Example 2 can optionally include wherein the semiconductor chip comprises a second load electrode arranged at the second surface of the semiconductor chip, the second load electrode is mechanically and electrically connected to the first surface of the metal plate.

In Example 4, the subject matter of Example 3 can optionally include wherein the metal plate is electrically connected to a second external terminal of the semiconductor chip package, wherein the first external terminal and the second external terminal form parts of a leadframe.

In Example 5, the subject matter of Example 2 can optionally include wherein the semiconductor chip comprises a second load electrode arranged at the first surface of the semiconductor chip, the second load electrode is mechanically and electrically connected to a second external terminal of the semiconductor chip package, wherein the first external terminal and the second external terminal form parts of a leadframe.

In Example 6, the subject matter of Examples 4 or 5 can optionally include wherein the semiconductor chip comprises a control electrode arranged at the first surface of the semiconductor chip, the control electrode is mechanically and electrically connected to a third external terminal of the semiconductor chip package, wherein the first external terminal, the second external terminal and the third external terminal form parts of the leadframe.

In Example 7, the subject matter of any one of Examples 1 to 6 can optionally include wherein the metal plate has a thickness measured between the first and second surfaces of the metal plate of equal to or greater than 1.0, 1.25, 1.5, 1.75, or 2.0 times a thickness of the electrically conducting carrier.

In Example 8, the subject matter of any one of Examples 1 to 7 can optionally include wherein the metal plate has a thickness measured between the first and second surfaces of the metal plate of equal to or greater than 0.2 mm, 0.3 mm, 0.4 mm, 0.5 mm, 0.6 mm, 0.7 mm, or 0.8 mm.

In Example 9, the subject matter of any one of Examples 1 to 8 can optionally include wherein an area size of the exposed second surface of the metal plate is equal to or greater than 20 mm$^2$, 25 mm$^2$, 30 mm$^2$, or 35 mm$^2$.

In Example 10, the subject matter of any one of Examples 1 to 9 can optionally include further including an encapsulant embedding the electrically conducting carrier, the semiconductor chip and the metal plate, wherein a ratio of an area size of the exposed second surface of the metal plate and an area size as defined by an outline of the encapsulant is equal to or greater than 0.7, 0.8, 0.85, or 0.9.

In Example 11, the subject matter of any one of Examples 1 to 10 can optionally include wherein a frame portion of the encapsulant covers at least one side face of the metal plate, and wherein a width of the frame portion is equal to or less than 0.5 mm, 0.4 mm, 0.3 mm, 0.2 mm or 0.1 mm.

In Example 12, the subject matter of Examples 10 or 11 can optionally include wherein a surface of the encapsulant levels with the exposed second surface of the metal plate.

In Example 13, the subject matter of any one of Examples 1 to 9 can optionally include further including an encapsulant embedding the electrically conducting carrier and the semiconductor chip, wherein all side faces of the metal plate are exposed from the encapsulant.

Example 14 is a control unit device, including a substrate, a semiconductor chip package of any one of the preceding examples mounted on the substrate, and a housing accommodating the substrate and the semiconductor chip package, whereby the exposed second surface of the metal plate is mechanically connected to a heat sink.

In Example 15, the subject matter of Example 14 can optionally include wherein the heat sink is a wall of the housing or is a convection plate contained in the housing.

Example 16 is a method of manufacturing a semiconductor chip package, including placing a metal plate on a temporary carrier, bonding a semiconductor chip on the metal plate, bonding an electrically conducting carrier on the semiconductor chip, wherein the electrically conducting carrier forms a first external terminal of the semiconductor chip package, applying an encapsulation material to the electrically conducting carrier, the semiconductor chip and the temporary carrier to form an encapsulant, and removing the temporary carrier from the encapsulant.

In Example 17, the subject matter of Example 16 can optionally include wherein the encapsulant is formed by molding, in particular by transfer molding without film-assist at the temporary carrier.

In Example 18, the subject matter of Examples 16 or 17 can optionally include further including bonding a second external terminal of the semiconductor chip package on the metal plate.

In Example 19, the subject matter of Example 18 can optionally include wherein the first external terminal and the second external terminal form parts of a leadframe.

In Example 20, the subject matter of any one of Examples 16 to 19 can optionally include further including bonding a third external terminal of the semiconductor chip package on the semiconductor chip.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor chip package, comprising:
   an electrically conducting carrier comprising a first external terminal;
   an electrically conducting lead comprising a second external terminal;
   a semiconductor chip disposed on an uppermost surface of the electrically conducting carrier, wherein the semiconductor chip has a first surface facing the electrically conducting carrier, a second surface opposite the first surface, a first load electrode that is electrically connected to the first external terminal and a second load electrode that is electrically connected to the second external terminal;
   a metal plate having a first surface mechanically connected to the second surface of the semiconductor chip via a first substantially uniform thickness bonding layer and a second surface opposite the first surface of the metal plate;
   an encapsulant embedding the electrically conducting carrier, the semiconductor chip, the lead and the metal plate; and
   a second substantially uniform thickness bonding layer that is directly attached to the first surface of the metal plate and to an upper surface of the lead, the second substantially uniform thickness bonding layer providing an electrical connection between the metal plate and the lead,
   wherein the metal plate completely overlaps the second surface of the semiconductor chip,
   wherein the first surface of the metal plate forms a complete planar surface at one side of the metal plate that extends to all outer lateral edge sides of the metal plate,
   wherein the encapsulant comprises substantially planar upper and lower surfaces that are opposite from one another,
   wherein the second surface of the metal plate is exposed from and substantially coplanar with the upper surface of the encapsulant,
   wherein the exposed second surface of the metal plate is laterally surrounded by the upper surface of the encapsulant in every direction,
   wherein lower surfaces of the lead and the electrically conducting carrier are exposed from and substantially coplanar with the lower surface of the encapsulant.

2. The semiconductor chip package of claim 1, wherein the second load electrode is mechanically and electrically connected to the first surface of the metal plate.

3. The semiconductor chip package of claim 1, wherein the first external terminal and the second external terminal form parts of a leadframe.

4. The semiconductor chip package of claim 1, wherein the semiconductor chip comprises a control electrode arranged at the first surface of the semiconductor chip, wherein the control electrode is mechanically and electrically connected to a third external terminal of the semiconductor chip package, and wherein the first external terminal, the second external terminal and the third external terminal form parts of a leadframe.

5. The semiconductor chip package of claim 1, wherein the metal plate has a thickness measured between the first and second surfaces of the metal plate of equal to or greater than 1.0 times a thickness of the electrically conducting carrier.

6. The semiconductor chip package of claim 1, wherein the metal plate has a thickness measured between the first and second surfaces of the metal plate of equal to or greater than 0.2 mm.

7. The semiconductor chip package of claim 1, wherein an area size of the exposed second surface of the metal plate is equal to or greater than 20 mm$^2$.

8. The semiconductor chip package of claim 1,
   wherein a ratio of an area size of the exposed second surface of the metal plate and an area size as defined by an outline of the encapsulant is equal to or greater than 0.7.

9. The semiconductor chip package of claim 8, wherein a frame portion of the encapsulant covers at least one side face of the metal plate, and wherein a width of the frame portion is equal to or less than 0.5 mm.

10. The semiconductor chip package of claim 1, wherein the first and second bonding layers are solder layers having a substantially uniform thickness of no greater than 0.06 mm.

11. A control unit device, comprising:
    a substrate;
    a semiconductor chip package mounted on the substrate, the semiconductor chip package comprising:
    an electrically conducting carrier comprising a first external terminal;
    an electrically conducting lead comprising a second external terminal;
    a semiconductor chip disposed on an uppermost surface of the electrically conducting carrier, the semiconductor chip having a first surface facing the electrically conducting carrier, a second surface opposite the first surface, a first load electrode that is electrically connected to the first external terminal and a second load electrode that is electrically connected to the second external terminal;
    a metal plate having a first surface mechanically connected to the second surface of the semiconductor chip via a first substantially uniform thickness bonding layer and a second surface opposite the first surface of the metal plate, the metal plate completely overlapping the second surface of the semiconductor chip;

an encapsulant embedding the electrically conducting carrier, the semiconductor chip, the electrically conducting lead and the metal plate;

a second substantially uniform thickness bonding layer that is directly attached to the first surface of the metal plate and to an upper surface of the electrically conducting lead, the second substantially uniform thickness bonding layer providing an electrical connection between the metal plate and the electrically conducting lead, and a housing accommodating the substrate and the semiconductor chip package so that the surface of the metal plate is mechanically connected to a heat sink, wherein the first surface extends completely along a single plane to all outer lateral edge sides of the metal plate, wherein the encapsulant comprises substantially planar upper and lower surfaces that are opposite from one another, wherein the second surface of the metal plate is exposed from and substantially coplanar with the upper surface of the encapsulant, wherein the exposed second surface of the metal plate is laterally surrounded by the upper surface of the encapsulant in every direction, wherein lower surfaces of the electrically conducting lead and the electrically conducting carrier are exposed from and substantially coplanar with the lower surface of the encapsulant.

12. The control unit device of claim 11, wherein the heat sink is a wall of the housing or is a convection plate contained in the housing.

13. The control unit device of claim 11, wherein the first and second bonding layers are solder layers having a substantially uniform thickness of no greater than 0.06 mm.

* * * * *

UNITED STATES PATENT AND TRADEMARK OFFICE
CERTIFICATE OF CORRECTION

PATENT NO.        : 10,727,151 B2
APPLICATION NO.   : 15/605091
DATED             : July 28, 2020
INVENTOR(S)       : L. Chen et al.

Page 1 of 1

It is certified that error appears in the above-identified patent and that said Letters Patent is hereby corrected as shown below:

In the Claims

Column 17, Line 15 Claim 11, Line 34 change "the surface" to -- the second surface --

Signed and Sealed this
Twenty-ninth Day of September, 2020

Andrei Iancu
*Director of the United States Patent and Trademark Office*